US010600037B2

(12) United States Patent
Arya et al.

(10) Patent No.: US 10,600,037 B2
(45) Date of Patent: *Mar. 24, 2020

(54) EFFICIENT SCHEDULING OF MAINTENANCE FOR POWER DISTRIBUTION SYSTEMS

(71) Applicant: INTERNATIONAL BUSINESS MACHINES CORPORATION, Armonk, NY (US)

(72) Inventors: Vijay Arya, Bangalore (IN); Lawrence K. Chalupsky, East Gull Lake, MN (US); Ramachandra Kota, Hyderabad (IN); Krishnan L. Narayan, McKinney, TX (US)

(73) Assignee: International Business Machines Corporation, Armonk, NY (US)

( * ) Notice: Subject to any disclaimer, the term of this patent is extended or adjusted under 35 U.S.C. 154(b) by 104 days.

This patent is subject to a terminal disclaimer.

(21) Appl. No.: 15/719,723

(22) Filed: Sep. 29, 2017

(65) Prior Publication Data
US 2019/0102748 A1 Apr. 4, 2019

(51) Int. Cl.
*G06Q 10/00* (2012.01)
*G01R 31/08* (2020.01)

(52) U.S. Cl.
CPC .......... *G06Q 10/20* (2013.01); *G01R 31/088* (2013.01)

(58) Field of Classification Search
CPC .............................. G06Q 10/00; G06Q 40/06
USPC .................................................. 705/7.11
See application file for complete search history.

(56) References Cited

U.S. PATENT DOCUMENTS

| 7,031,927 | B1 * | 4/2006 | Beck | C02F 1/008 |
| | | | | 705/7.24 |
| 7,177,821 | B2 * | 2/2007 | Ikeda | G05B 23/0283 |
| | | | | 705/7.25 |
| 7,769,617 | B2 * | 8/2010 | Iwasaki | G06Q 10/063112 |
| | | | | 705/7.26 |
| 8,487,772 | B1 | 7/2013 | Higgins | |
| 9,164,663 | B1 * | 10/2015 | Berard | G06Q 10/06 |

(Continued)

OTHER PUBLICATIONS

Arya et al., "Efficient Scheduling of Maintenance for Power Distribution Systems", U.S. Appl. No. 15/854,969, filed Dec. 27, 2017.
List of IBM Patents or Patent Applications Treated as Related. Filed Dec. 27, 2017. 2 pages.
T&D World Magazine, "Hydro-Quebec Selects Sensors for Advanced Fault Detection Application", Smart Utility, LineWatch supports Canada's Largest Utility with Voltage-Based Fault Detection, Mar. 1, 2016, 14 pages.

(Continued)

*Primary Examiner* — Romain Jeanty
(74) *Attorney, Agent, or Firm* — L. Jeffrey Kelly

(57) ABSTRACT

According to one or more embodiments, a method, a computer program product, and a computer system for managing vegetation across distribution systems are provided. The method may include receiving, by a computer, voltage data from one or more data sensors. The computer may determine one or more locations of one or more voltage fault conditions based on the received voltage data. A score may be assigned to each of the determined locations by the computer. The computer may then identify a subset of one or more work orders corresponding to the one or more determined locations from among a database of work orders. A subset of locations may be determined by the computer from among the one or more locations based on the assigned scores and the identified subset of work orders. A field visit may then be scheduled by the computer based on the determined subset of locations.

17 Claims, 6 Drawing Sheets

Networked Computer Environment

(56) References Cited

U.S. PATENT DOCUMENTS

| | | | |
|---|---|---|---|
| 9,811,370 | B2 | 11/2017 | DeJana et al. |
| 9,910,102 | B2 * | 3/2018 | Stoupis ............... G01R 31/40 |
| 10,115,158 | B2 * | 10/2018 | Lindores ............. A01B 79/005 |
| 2004/0236620 | A1 | 11/2004 | Chauhan et al. |
| 2006/0271313 | A1 | 11/2006 | Mollenkopf |
| 2007/0118310 | A1 | 5/2007 | Kindseth et al. |
| 2007/0185660 | A1 * | 8/2007 | Anderson ......... H04W 52/0219 702/41 |
| 2010/0198775 | A1 * | 8/2010 | Rousselle ............ A01B 79/005 706/54 |
| 2012/0086459 | A1 | 4/2012 | Kim |
| 2012/0109614 | A1 * | 5/2012 | Lindores ............. A01B 79/005 703/11 |
| 2013/0073716 | A1 | 3/2013 | DeJana et al. |
| 2013/0261797 | A1 | 10/2013 | Hyde et al. |
| 2014/0012732 | A1 * | 1/2014 | Lindores ............. A01B 79/005 705/37 |
| 2014/0324506 | A1 | 10/2014 | Garrity et al. |
| 2015/0131079 | A1 | 5/2015 | Heinonen et al. |

OTHER PUBLICATIONS

Mell et al., "The NIST Definition of Cloud Computing", Recommendations of the National Institute of Standards and Technology, Special Publication 800-145, Sep. 2011, 7 pages.

Hall, "Out of Sight, Out of Mind 2012", An Updated Study on the Undergrounding of Overhead Power Lines, Edison Electric Institute, Jan. 2013, 77 pages.

Tremblay et al., "Accurate Fault-Location Technique Based on Distributed Power-Quality Measurements", C I R E D, 19th International Conference on Electricity Distribution, Vienna, May 21-24, 2007, Paper 0615, 4 pages.

Tremblay, "Determining the Location and Cause of Faults in Power Distribution System With an ARC Voltage Evaluation Method", www.ieee-pes.org/presentations/gm2014/PESGM2014P-002549. pdf, IEEE PES Power & Energy Society, 2014, 24 pages.

Pacificcorp, "Transmission & Distribution Vegetation Management Program", Specification Manual, Jun. 24, 2014, pp. 1-128.

* cited by examiner

Networked Computer Environment

System Block Diagram

Operational Flowchart

Computer Hardware Components

Cloud Computing Environment

Cloud Computing Functional Layers

EFFICIENT SCHEDULING OF MAINTENANCE FOR POWER DISTRIBUTION SYSTEMS

BACKGROUND

The present invention relates generally to the field of power distribution, and more particularly to maintenance of power distribution systems.

A significant number of work orders for maintenance may be generated due to voltage fluctuations caused by vegetation overgrowth. For example, more than half of all power outages may be weather related, and half of these outages may be attributed to vegetation contact with utility lines, poles, and others system components. When a tree branch touches an overhead conductor, there may be, among other things, a persistent flickering of lights or an outage. Customers in a given neighbourhood may contact the utility company to report the outage, and a crew may be sent out to localise and rectify these faults. However, during critical times, there may not be enough crews to perform field visits at each location, and customers may be without power for long periods of time while they wait for a utility crew to be dispatched for their outage. Additionally, it may be costly to provide maintenance for power distribution systems, and utilities may budget millions of dollars annually for vegetation maintenance in particular.

SUMMARY

Embodiments of the present invention disclose a method, system, and computer program product for managing vegetation growth across a distribution system. According to one embodiment, a method for managing vegetation growth across a distribution system is provided. The method may include receiving, by a computer, voltage data from one or more data sensors. The computer may determine one or more locations of one or more voltage fault conditions based on the received voltage data. A score may be assigned to each of the determined locations by the computer. The computer may then identify a subset of one or more work orders corresponding to the one or more determined locations from among a database of work orders. A subset of locations may be determined by the computer from among the one or more locations based on the assigned scores and the identified subset of work orders. A field visit may then be scheduled by the computer based on the determined subset of locations.

According to another embodiment, a computer system for managing vegetation growth across a distribution system is provided. The computer system may include one or more processors, one or more computer-readable memories, one or more non-transitory computer-readable tangible storage devices, and program instructions stored on at least one of the one or more storage devices for execution by at least one of the one or more processors via at least one of the one or more memories, whereby the computer system is capable of performing a method. The method may include receiving, by a computer, voltage data from one or more data sensors. The computer may determine one or more locations of one or more voltage fault conditions based on the received voltage data. A score may be assigned to each of the determined locations by the computer. The computer may then identify a subset of one or more work orders corresponding to the one or more determined locations from among a database of work orders. A subset of locations may be determined by the computer from among the one or more locations based on the assigned scores and the identified subset of work orders. A field visit may then be scheduled by the computer based on the determined subset of locations.

According to yet another embodiment, a computer program product for managing vegetation growth across a distribution system is provided. The computer program product may include one or more computer-readable storage devices and program instructions stored on at least one of the one or more tangible storage devices, the program instructions executable by a processor. The program instructions are executable by a processor for performing a method that may accordingly include receiving, by a computer, voltage data from one or more data sensors. The computer may determine one or more locations of one or more voltage fault conditions based on the received voltage data. A score may be assigned to each of the determined locations by the computer. The computer may then identify a subset of one or more work orders corresponding to the one or more determined locations from among a database of work orders. A subset of locations may be determined by the computer from among the one or more locations based on the assigned scores and the identified subset of work orders. A field visit may then be scheduled by the computer based on the determined subset of locations.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of the present invention relate generally to the field of power distribution, and more particularly to maintenance of power distributions systems. The following described exemplary embodiments provide a system, method and program product to, among other things, manage vegetation across a distribution system. As previously described, a significant number of work orders may be generated due to voltage fluctuations caused by vegetation overgrowth. Each of these work orders may require a utility crew to perform a field visit to one or more locations within the distribution system, and during critical times, customers may be without power for long periods of time while they await a crew to restore an outage. It may, therefore, be advantageous to create a group of locations in order to consolidate work orders into a single field visit, based on factors such as criticality or proximity. Therefore, embodiments of the present invention have the capacity to improve the field of maintaining power distribution systems by determining locations where vegetation may come in contact with power lines within the system, scheduling maintenance at a group of locations, notifying the utility crew of a scheduled field visit at the group of locations, and predicating when a future field visit may be required. Thus, the computer-implement method, computer system, and computer program product disclosed herein may, among other things, be used to minimize the number of maintenance field visits and to maximize the effectiveness of utility crews during these field visits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

Figure 1:
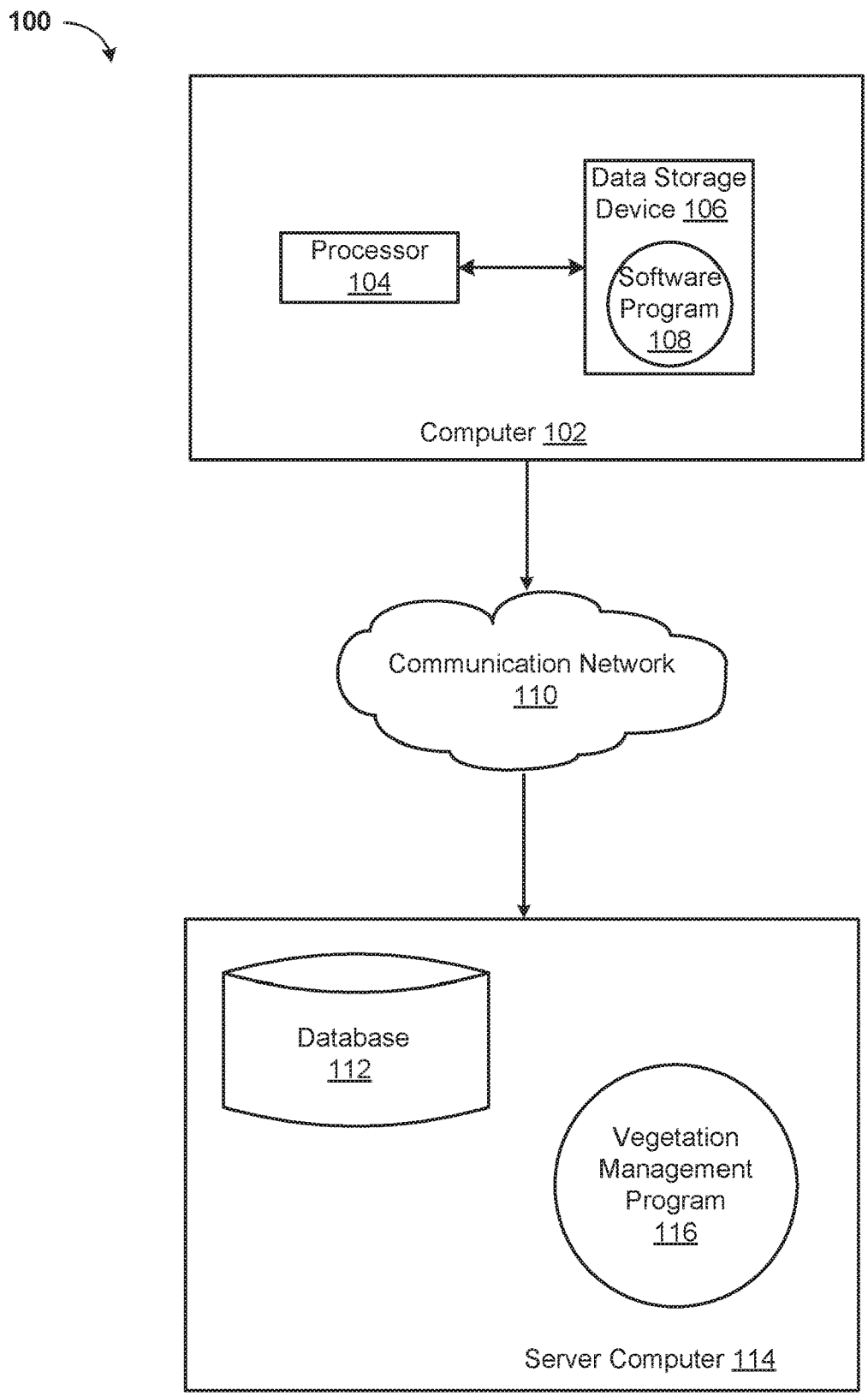
FIG. 1 illustrates a networked computer environment according to at least one embodiment.

The following described exemplary embodiments provide a system, method and program product that optimizes service calls for conditions caused by vegetation along a distribution network. Referring now to FIG. 1, a functional block diagram illustrating a Vegetation Management System 100 (hereinafter "system") for managing vegetation across distribution systems by scheduling an optimal set of field visits that maximize the work performed by a utility crew is shown. It should be appreciated that FIG. 1 provides only an illustration of one implementation and does not imply any limitations with regard to the environments in which different embodiments may be implemented. Many modifications to the depicted environments may be made based on design and implementation requirements.

The system 100 may include a computer 102 and a server computer 114. The computer 102 may communicate with the server computer 114 via a communication network 110 (hereinafter "network"). The computer 102 may include a processor 104 and a software program 108 that is stored on a data storage device 106 and is enabled to interface with a user and communicate with the server computer 114. As will be discussed below with reference to FIG. 4 the computer 102 may include internal components 800A and external components 900A, respectively, and the server computer 114 may include internal components 800B and external components 900B, respectively. The computer 102 may be, for example, a mobile device, a telephone, a personal digital assistant, a netbook, a laptop computer, a tablet computer, a desktop computer, or any type of computing devices capable of running a program, accessing a network, and accessing a database.

The server computer 114 may operate in a cloud computing service model, such as Software as a Service (SaaS), Platform as a Service (PaaS), or Infrastructure as a Service (IaaS), as discussed below. The server computer 114 may also be located in a cloud computing deployment model, such as a private cloud, community cloud, public cloud, or hybrid cloud. The server computer 114, which may be used for managing vegetation across a distribution system, is enabled to run a Vegetation Management Program 116 (hereinafter "program") that may interact with a database 112. The Vegetation Management Program method is explained in more detail below with respect to FIG. 3. In one embodiment, the computer 102 may operate as an input device including a user interface while the program 116 may run primarily on server computer 114. In an alternative embodiment, the program 116 may run primarily on one or more computers 102 while the server computer 114 may be used for processing and storage of data used by the program 116. It should be noted that the program 116 may be a standalone program or may be integrated into a larger vegetation management program. According to another embodiment, processing for the program 116 may, in some instances be shared amongst the computers 102 and the server computers 114 in any ratio. In another embodiment, the program 116 may operate on more than one computer, server computer, or some combination of computers and server computers, for example, a plurality of computers 102 communicating across the network 110 with a single server computer 114. In another embodiment, for example, the program 116 may operate on a plurality of server computers 114 communicating across the network 110 with a plurality of client computers 102. Alternatively, the program may operate on a network server communicating across the network with a server and a plurality of client computers.

The network 110 may include wired connections, wireless connections, fiber optic connections, or some combination thereof. In general, the network 110 can be any combination of connections and protocols that will support communications between the computer 102 and the server computer 114. The network 110 may include various types of networks, such as, for example, a local area network (LAN), a wide area network (WAN) such as the Internet, a telecommunication network, a wireless network, a public switched network and/or a satellite network.

Figure 2:
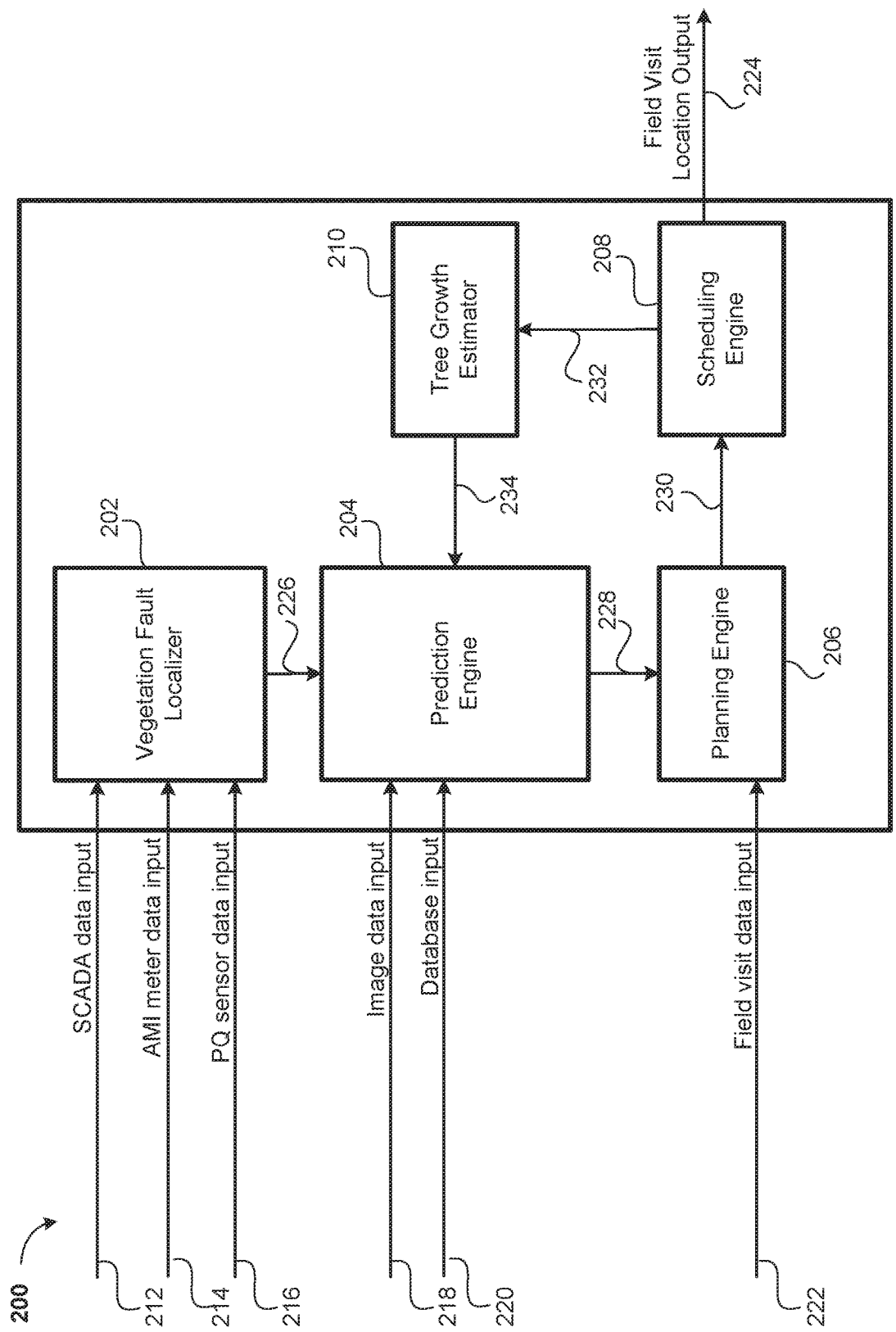
FIG. 2 depicts a block diagram of a system that manages vegetation across distribution systems according to at least one embodiment.

Referring to FIG. 2, an exemplary block diagram of a system 200 for managing vegetation across power distribution systems according to one embodiment is depicted. The system 200 may include, among other things, a vegetation fault localizer 202, a prediction engine 204, a planning engine 206, a scheduling engine 208, and a tree growth estimator 210. The system 200 may receive one or more data inputs, such as a supervisory control and data acquisition (SCADA) data input 212, an advanced metering infrastructure (AMI) meter data input 214, a power quality (PQ) sensor data input 216, an image source data input 218, an active work order data input 220, and a field visit data input 222. The system 200 may also include a field visit location output 224 and one or more data links 226, 228, 230, and 232. It may be appreciated that the system 200 may be run in hardware, software, or any combination of the two in any ratio. In one embodiment, the program 116 may provide control to the system 200 in order to provide vegetation management. In an alternate embodiment, the program 116 may include code configured to execute program associated with the system 200.

The vegetation fault localizer 202 may, among other things, determine where a fault in the power system may occur due to vegetation overgrowth. As previously described, vegetation may touch a primary conductor within the power distribution system and may cause voltage fluctuations and outages. The vegetation fault localizer 202 may receive input data corresponding to voltage history from the SCADA data input 212, the AMI meter data input 214, and the PQ sensor data input 216, historical records of visits by field crews, and image data. Smart meters in customer premises report interval voltage data and events, such as voltage sags/swells, last gasp, etc. The SCADA data input 212 may receive voltage measurements from one or more substation and/or distribution SCADA devices that may measure a voltage at a feeder or at points along the power distribution system. The AMI meter data input 214 may receive voltage data-streams from one or more AMI meters, which may be used to detect and localize events where vegetation is in contact with transmission lines and causing power disturbances. The PQ sensor data input 216 may receive voltage measurements and information corresponding to sags and swells from one or more temporary, low-cost power quality sensors deployed by utility companies. The voltage data received by the SCADA devices, AMI meters, and PQ sensors may correspond to, for example, voltage conditions across the distribution system, such as fluctuation, outage, "sag," "flicker," "one-leg down," "pole-to-pole wire down," and "hazard," etc. which may also be available via records from crew visits. Each of these voltage conditions may present with a distinct, characteristic pattern of voltage levels and voltage spikes over a time interval. The vegetation fault localizers may access a connectivity model map stored within the database 112 (FIG. 1) on the server computer 114 (FIG. 1). The connectivity model map may include, among other things, the location of one or more SCADA sensors, AMI meters, and PQ sensors. The connectivity model map may specify interconnections between feeder lines, phases, and systems components like transformers and customers within the distribution network. When a fault may occur on a power line, the voltage provided to customers downstream of the fault may be affected, so it may help to localize faults from SCADA, AMI, and PQ data. The connectivity model map may also indicate the number of customers that may be impacted by a fault. The vegetation fault localizer may use the connectivity model map to localize vegetation faults within the power distribution systems based on the voltage fluctuations detected by the data sensors. It may also use machine-learning algorithms on historical SCADA, AMI, PQ data, and crew visit records, and image data to predict which faults in the network may be caused by vegetation.

The prediction engine 204 may receive the location data from the vegetation fault localizer 202 via a data link 226. The prediction engine 204 may also receive, via the image source data input 218, image source data. The image source data may include, among other things, satellite imagery, street-view images, and images from unmanned aircraft. The prediction engine 204 may also receive historical vegetation estimate data from the tree growth estimator 210 via a data link 232. The tree growth estimator 210 will be described in more detail below. The prediction engine 204 may use the received image source data and the vegetation data to determine a criticality score associated with each of the locations. The criticality score may be used to determine one or more locations with a higher priority for a field visit. For example, a location with a higher score may require more immediate attention by a utility crew. The score may be a weighted score according to the formula:

$$S=W_C S_C + W_I S_I + W_P S_P + W_V S_V + W_T S_T,$$

where S may be the overall score; $S_c$ may be a subscore corresponding to a number of downstream customers affect by a fault; $S_i$ may be a subscore corresponding to the presence of vegetation within street-view, satellite, or unmanned aircraft images; $S_p$ may be a subscore corresponding to power quality measurements at a given location; $S_v$ may be a subscore assigned by the vegetation fault localizer 202; $S_T$ may be subscore assigned by the tree growth estimator 210; and $W_c$, $W_i$, $W_p$, $W_v$, and $W_T$ may be respective user-defined weights corresponding to each of the subscores.

The planning engine 206 may receive the scores generated by the prediction engine 204 corresponding to the one or more locations via a data link 228. The planning engine 206 may also receive a list of open, active work orders from the database 112 (FIG. 1) via the active work order data input 220. The database of work orders may contain a large number of individual work orders. However, there may be at least some work orders in which a location does not have vegetation or in which the work is of a lower priority. Accordingly, it may be advantageous to determine only those work orders that correspond to locations identified as having faults caused by vegetation. Therefore, the planning engine 206 may compare the received locations and the received open work orders and determine a subset of locations to which a utility crew may be sent. The subset of locations may be chosen in a way to minimize field visits ("field visits") by the utility company and maximize the work performed during each field visit. According to one embodiment, the subset may include a location determined by the prediction engine 204 to be the most critical and a number of active work orders received from the database 112 that correspond to locations within the vicinity of the determined critical location. According to an alternative embodiment, the subset of locations may include a location corresponding to a highest priority work order and a number of locations determined by the prediction engine 204 that are within the vicinity of the location of the highest priority work order. According to yet another embodiment, the subset of locations may include a plurality of locations from among the locations in the active work orders receive from the database 112 and determined by the prediction engine 204, either individually or in combination, corresponding to a greatest density of locations.

According to yet another embodiment, the planning engine 206 may receive a list $L_W$ from the database 112 corresponding to locations of one or more existing work orders. The planning engine 206 may also receive a list $L_P$ from the prediction engine 204, corresponding to locations with criticality scores greater than 0. A geo-distance based clustering algorithm may be applied on the combined set of locations from $L_W$ and $L_P$ to obtain one or more location groups $L_{Gx}$. A threshold distance may be used as factor in the clustering algorithms that may be set by the utility company. A max cluster size may also be set by the utility company to impose a limit on the number of locations present in one cluster. Each location group $L_{Gx}$ may now be considered as a new work order in the system. For each location group $L_{Gx}$, if the group contains locations from $L_W$, a group work order date may be obtained as the minimum of the work order dates originally assigned to the locations from $L_W$ in $L_{Gx}$. If the group contains locations from $L_P$, then a group criticality score may be obtained as the maximum of the criticality scores of the locations $L_P$ in $L_{Gx}$. New work order dates may be assigned to each location group $L_{Gx}$ as a function of the existing group work order date and group criticality score: Based on the new set of work orders with assigned dates, a utility crew may conduct a field visit to trim trees and vegetation, along with other operations.

The scheduling engine 208 may receive the subset of locations from the planning engine 206 via a data link 230. The scheduling engine 208 may accordingly schedule a field visit for the utility crew to complete the ordered work at the received subset of locations and notify the utility crew of the time and location of the field visit via the field visit schedule output 224. The scheduling engine 208 may direct the utility crew to collect information during the field visit, such as an amount of vegetation, an amount of vegetation growth, types of vegetation present at the locations, or a survey of nearby locations.

The tree growth estimator 210 may receive feedback from the utility crews after the field visits to determine the extent of vegetation growth. For example, during a field visit, a crew may note that vegetation grew by a certain amount or that a certain type of vegetation may be present. The growth of this vegetation may be calculated to determine when the location may need a future field visit. The tree growth estimator 210 may receive the information the scheduling engine 208 requested the utility crew to collect via the field visit data input 222. The tree growth estimator 210 may calculate an amount of vegetation growth since the last field visit to the location. Thus, the tree growth estimator 210 may determine a time at which the vegetation at the location may grow to a pre-determined amount based on the calculated rate of vegetation growth. The tree growth estimator 210 may then transmit this determined time to the prediction engine 204 via a data link 232 for use in determining locations and times for future field visits.

Figure 3:
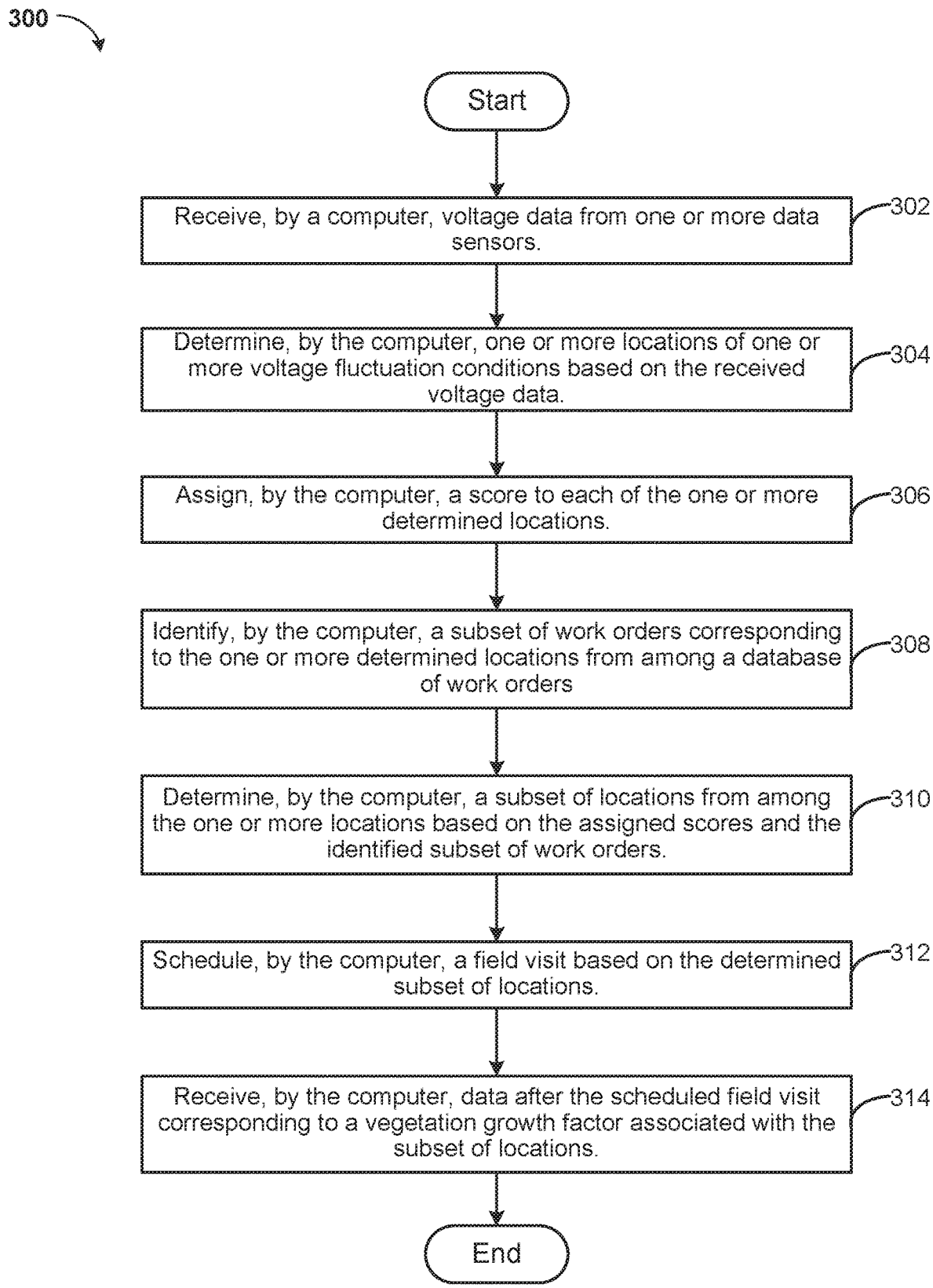
FIG. 3 is an operational flowchart illustrating the steps carried out by a program that manages vegetation across distribution systems, according to at least one embodiment.

Referring now to FIG. 3, an operational flowchart 300 illustrating the steps carried out by a program that manages vegetation across distribution systems is depicted. FIG. 3 may be described with the aid of FIGS. 1 and 2. As previously described, the Vegetation Management Program 116 (FIG. 1) may manage vegetation across a distribution system by scheduling an optimal set of field visits that maximize the work performed by a utility crew.

At 302, voltage data may be received by a computer from one or more data sensors. In operation, the program 116 may receive data from SCADA sensors, AMI meters, and PQ sensors via data inputs 212, 214, and 216, respectively. The program 116 may determine that a voltage event is either likely to be caused by vegetation (e.g., sag) or not likely to be caused by vegetation (flicker, one-leg down, pole-to-pole wire down, etc.). The program 116 may therefore determine which voltage fluctuation events may require a utility crew to perform vegetation maintenance.

At 304, one or more locations of one or more voltage fluctuation conditions is determined by the computer, based on the received voltage data. In operation, the program 116 may direct the vegetation fault localizer 202 to utilize the connectivity model map stored within the database 112 (FIG. 1) on the server computer 114 (FIG. 1). The vegetation fault localizer 202 may determine from the connectivity model map one or more locations associated with faults based on the voltage fluctuation conditions present at one or more of the sensors.

At 306, a score is assigned by the computer to each of the one or more determined locations. In operation, the program 116 (FIG. 1) may direct the prediction engine 204 to receive the subscores from the vegetation fault localizer 202 and the tree growth estimator 210. The program 116 may further direct the prediction engine 204 (FIG. 2) to calculate the subscores corresponding to images stored within the database 112 (FIG. 1) and the obtained vegetation data. The prediction engine 204 may then calculate total scores for each of the locations and optionally store them within the database 112.

At 308, a subset of one or more work orders corresponding to the one or more determined locations from among a database of work orders is identified by the computer. In operation, the planning engine 206 may receive a list of open, active work orders from the database 112 (FIG. 1) via the active work order data input 220 (FIG. 2). The planning engine 206 may sort through the database 112 to find all work orders associated with the locations identified by the prediction engine 204.

At 310, a subset of locations is determined by the computer from among the one or more locations based on the assigned scores and the identified subset of work orders. As discussed above, the subset of locations may be chosen in a way to minimize field visits (i.e., "truck rolls") by the utility company and to maximize the work performed by a utility crew during each field visit. In operation, the planning engine 206 may compare the received locations and the received open work orders received from the database 112 (FIG. 1) and determine a subset of locations to which a utility crew may be sent.

At 312, a field visit is scheduled by the computer based on the determined subset of locations. In operation, the scheduling engine 208 may determine an optimal time at which a utility crew may be dispatched. The scheduling engine 208 may record the time within the database 112 (FIG. 1) and may notify the utility crew of the field visit via the software program 108 (FIG. 1) on the computer 102 (FIG. 1). The scheduling engine 208 may also request the utility crew collect information during the field visit, such as an amount of vegetation, an amount of vegetation growth, types of vegetation present at the locations, or a survey of nearby locations.

At 314, data corresponding to a vegetation growth factor associated with the subset of locations is received by the computer after the scheduled field visit. In operation, the utility crew may enter field visit data using the software program 108 (FIG. 1) on the computer 102 (FIG. 1). The processor 104 (FIG. 1) may direct the software program 108 to transmit the data to the server computer 114 (FIG. 1) via the communication network 110 (FIG. 1), where it may be stored within the database 112 (FIG. 1). Alternatively, processor 104 may direct the software program 108 to store this data on the data storage device 106 (FIG. 1) for later use. The program 116 (FIG. 1) may direct the prediction engine 204 to access this data later in order to calculate a new criticality score for the location associated with the field visit data.

It may be appreciated that FIG. 3 provides only an illustration of one implementation and does not imply any limitations with regard to how different embodiments may be implemented. Many modifications to the depicted environments may be made based on design and implementation requirements.

Figure 4:
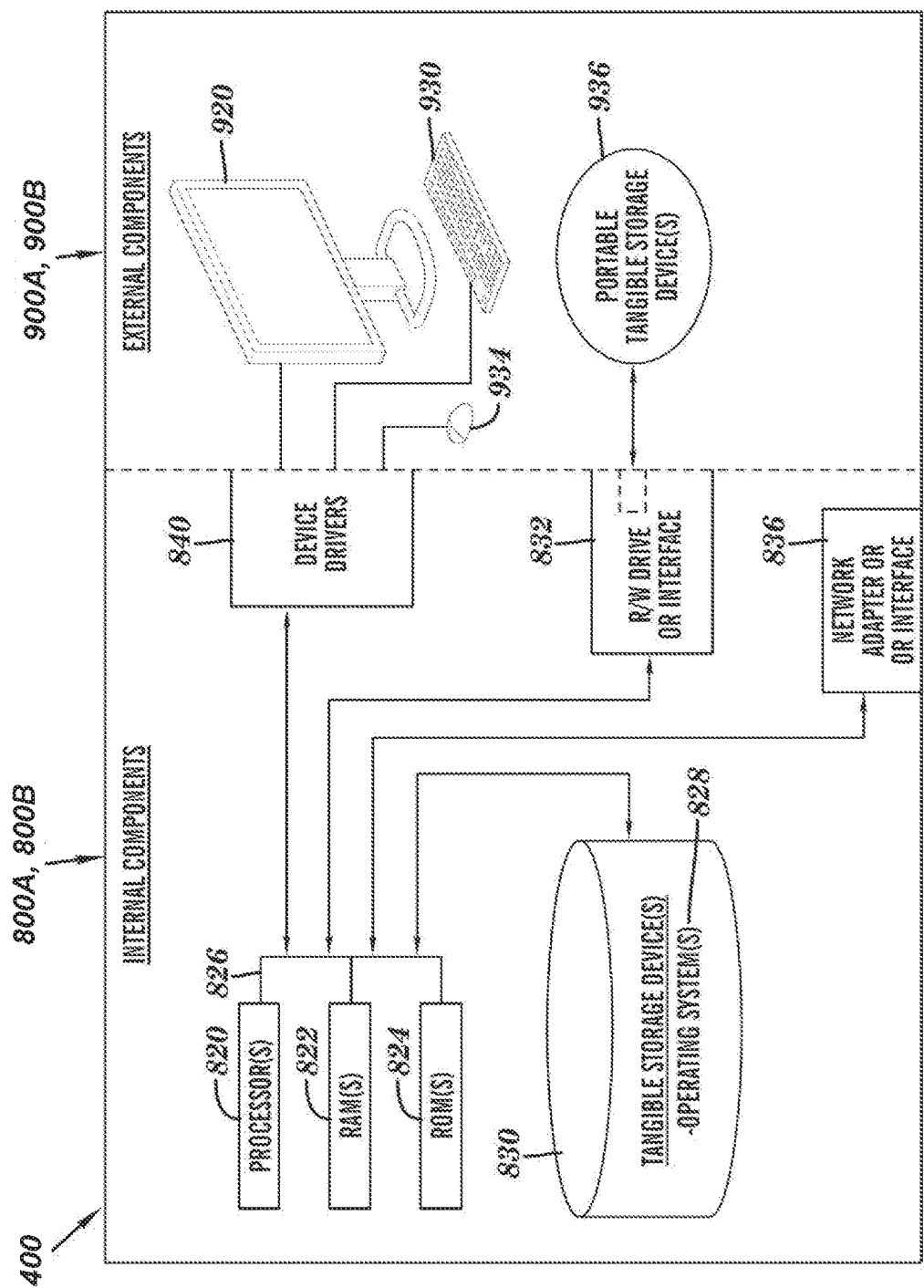
FIG. 4 is a block diagram of internal and external components of computers and servers depicted in FIG. 1 according to at least one embodiment.

FIG. 4 is a block diagram 400 of internal and external components of computers depicted in FIG. 1 in accordance with an illustrative embodiment of the present invention. It should be appreciated that FIG. 4 provides only an illustration of one implementation and does not imply any limitations with regard to the environments in which different embodiments may be implemented. Many modifications to the depicted environments may be made based on design and implementation requirements.

Computer 102 (FIG. 1) and server computer 114 (FIG. 1) may include respective sets of internal components 800A,B and external components 900A,B illustrated in FIG. 4. Each of the sets of internal components 800 include one or more processors 820, one or more computer-readable RAMs 822 and one or more computer-readable ROMs 824 on one or more buses 826, and one or more operating systems 828 and one or more computer-readable tangible storage devices 830. The one or more operating systems 828, the Software Program 108 (FIG. 1) and the Vegetation Management Program 116 (FIG. 1) on server computer 114 (FIG. 1) are stored on one or more of the respective computer-readable tangible storage devices 830 for execution by one or more of the respective processors 820 via one or more of the respective RAMs 822 (which typically include cache memory). In the embodiment illustrated in FIG. 4, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

Each set of internal components 800A,B also includes a R/W drive or interface 832 to read from and write to one or more portable computer-readable tangible storage devices 936 such as a CD-ROM, DVD, memory stick, magnetic tape, magnetic disk, optical disk or semiconductor storage device. A software program, such as the Software Program 108 (FIG. 1) and the Vegetation Management Program 116 (FIG. 1) can be stored on one or more of the respective portable computer-readable tangible storage devices 936, read via the respective R/W drive or interface 832 and loaded into the respective hard drive 830.

Each set of internal components 800A,B also includes network adapters or interfaces 836 such as a TCP/IP adapter cards; wireless Wi-Fi interface cards; or 3G, 4G, or 5G wireless interface cards or other wired or wireless communication links. The Software Program 108 (FIG. 1) and the Vegetation Management Program 116 (FIG. 1) on the server computer 114 (FIG. 1) can be downloaded to the computer 102 (FIG. 1) and server computer 114 from an external computer via a network (for example, the Internet, a local area network or other, wide area network) and respective network adapters or interfaces 836. From the network adapters or interfaces 836, the Software Program 108 and the Vegetation Management Program 116 on the server computer 114 are loaded into the respective hard drive 830. The network may comprise copper wires, optical fibers, wireless transmission, routers, firewalls, switches, gateway computers and/or edge servers.

Each of the sets of external components 900A,B can include a computer display monitor 920, a keyboard 930, and a computer mouse 934. External components 900A,B can also include touch screens, virtual keyboards, touch pads, pointing devices, and other human interface devices. Each of the sets of internal components 800A,B also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
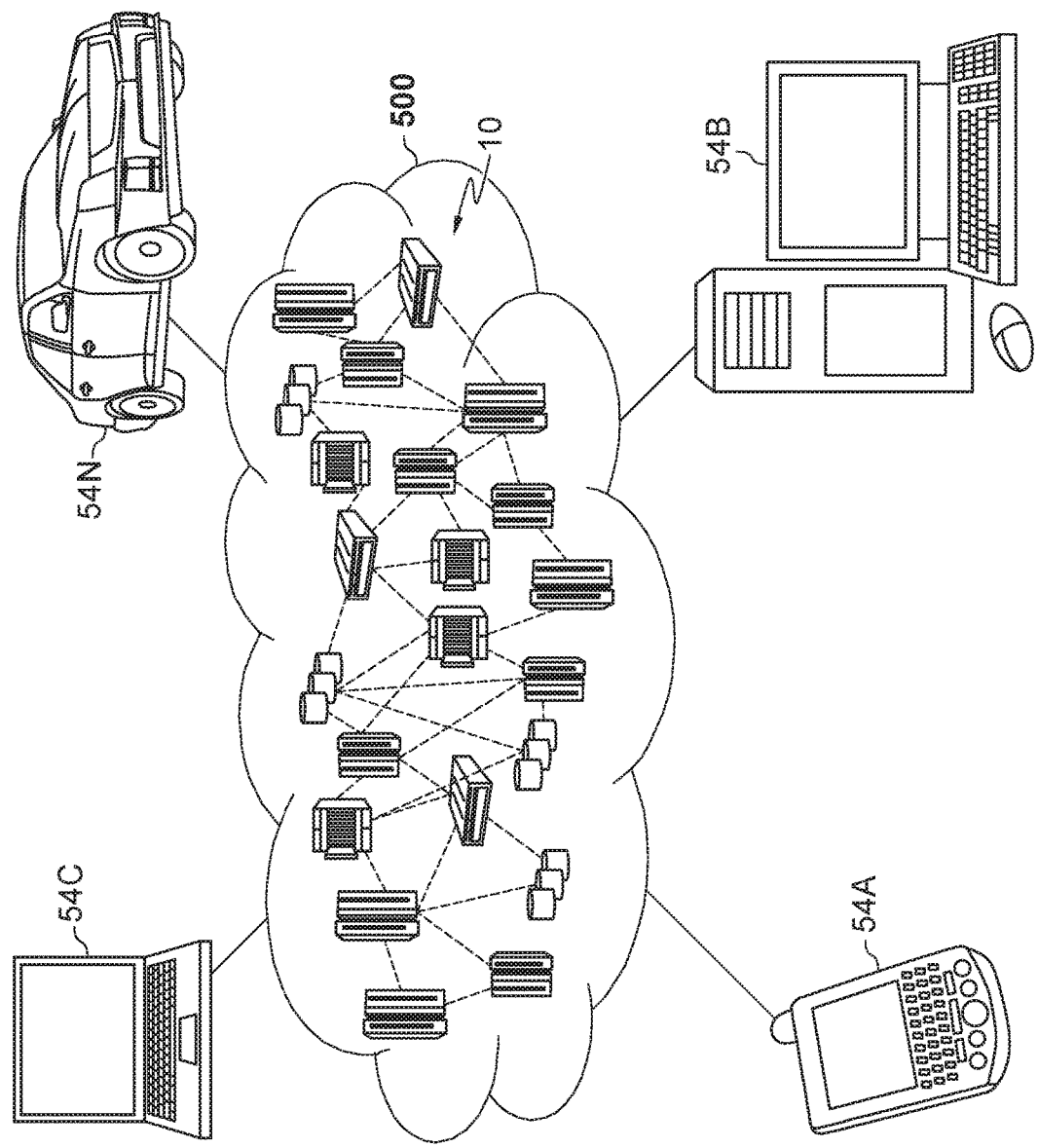
FIG. 5 is a block diagram of an illustrative cloud computing environment including the computer system depicted in FIG. 1, according to at least one embodiment.

Referring to FIG. 5, illustrative cloud computing environment 500 is depicted. As shown, cloud computing environment 500 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Cloud computing nodes 10 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 54A-N shown in FIG. 5 are intended to be illustrative only and that cloud computing nodes 10 and cloud computing environment 500 can communicate with any type of computerized device over any type of network and/or network addressable connection (e.g., using a web browser).

Figure 6:
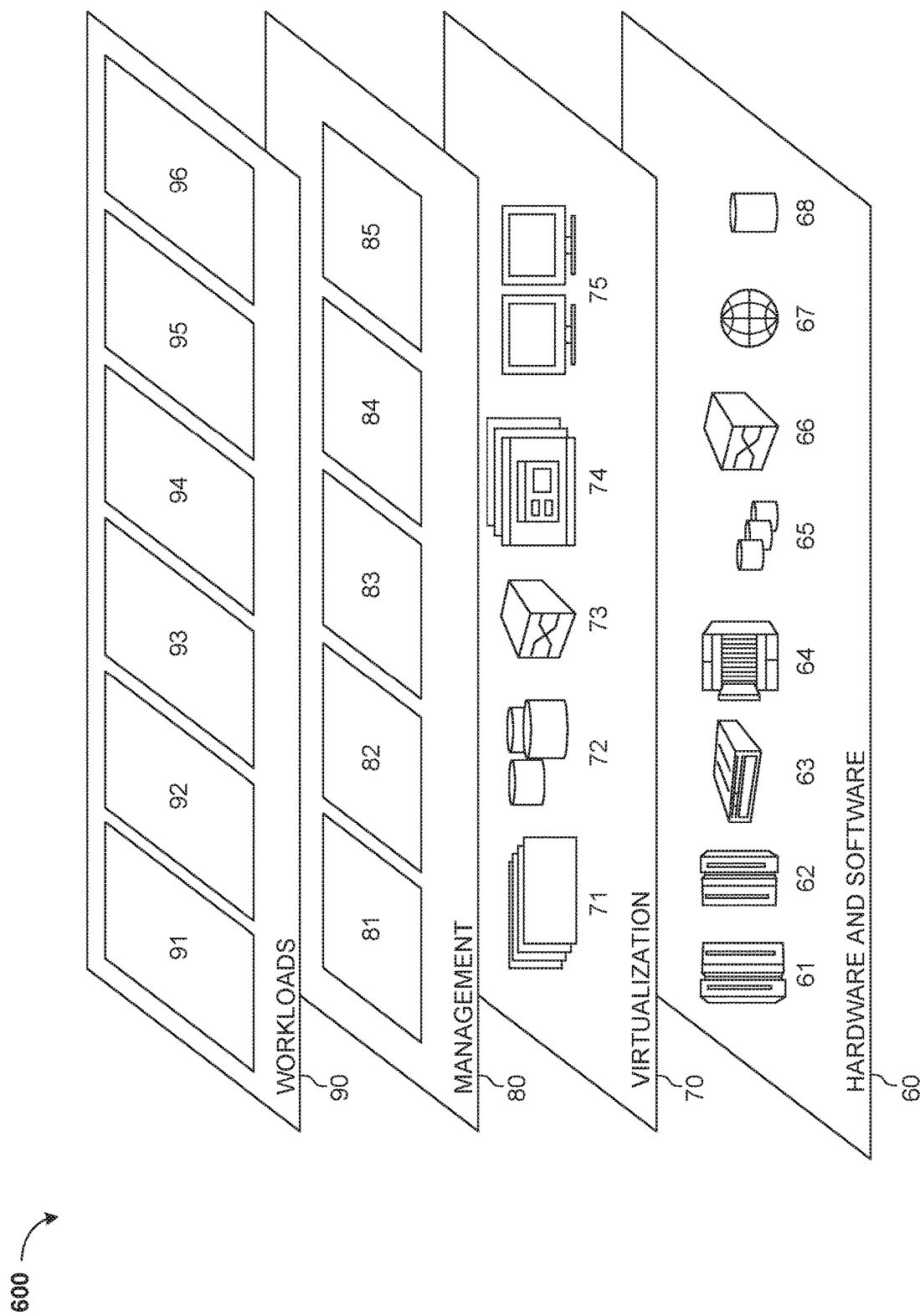
FIG. 6 is a block diagram of functional layers of the illustrative cloud computing environment of FIG. 5, according to at least one embodiment.

Referring to FIG. 6, a set of functional abstraction layers 600 provided by cloud computing environment 500 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and Vegetation Management 96. Vegetation Management 96 may manage vegetation across a distribution system by efficiently scheduling field visits by utility crews for maintenance.

The present invention may be a system, a method, and/or a computer program product at any possible technical detail level of integration. The computer program product may include a computer-readable non-transitory storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for managing vegetation across a distribution system, the method comprising:
    receiving, by a computer, voltage data from one or more data sensors;
    determining, by the computer, one or more locations of one or more voltage fault conditions based on the received voltage data and prior vegetation growth data associated with a prior field visit;
    assigning, by the computer, a score to each of the one or more determined locations, wherein the assigning the score to each of the one or more determined locations comprises;
        simultaneously calculating, by the computer, a sub-score corresponding to a number of downstream customers affected by one or more of the voltage fault conditions;
        simultaneously calculating, by the computer, a sub-score corresponding to the determine vegetation growth data from the one or more image sources;
        simultaneously calculating, by the computer, a sub-score corresponding to the voltage data from the one or more data sensors;
        receiving, by the computer, a weight value for each of the subscores; and
        calculating, by the computer, a weighted score from each of the calculated subscores and the received weight values;

identifying, by the computer, a subset of one or more work orders from among a database of work orders, the subset of work orders corresponding to the one or more determined locations;

determining, by the computer, a subset of locations from among the one or more locations based on the assigned scores and the identified subset of work orders; and scheduling, by the computer, a field visit based on the determined subset of locations.

2. The method of claim 1, further comprising:

receiving, by the computer, vegetation growth data associated with the subset of locations after the scheduled field visit.

3. The method of claim 2, further comprising:

determining, by the computer a time interval for a future field visit based on the received vegetation growth value; and scheduling, by the computer, the future field visit after the determined time interval.

4. The method of claim 1, wherein the one or more data sensors comprise at least one of:

a supervisory control and data acquisition (SCADA) sensor;

an advanced metering infrastructure (AMI) meter; and a power quality (PQ) sensor.

5. The method of claim 1, further comprising:

receiving, by the computer, one or more images from one or more image sources;

receiving, by the computer, vegetation growth data associated with a field visit; and calculate a vegetation growth value based on the received images.

6. The method of claim 5, wherein the one or more image sources comprise at least one of:

a street-view image;

a satellite image; and an image capture by an unmanned aircraft.

7. A computer program product for managing vegetation across a distribution system, the computer program product comprising:

one or more computer-readable non-transitory storage media and program instructions stored on the one or more computer readable non-transitory storage media, the program instructions comprising:

program instructions to receive, by a computer, voltage data from one or more data sensors;

program instructions to determine, by the computer, one or more locations of one or more voltage fault conditions based on the received voltage data and prior vegetation growth data associated with a prior field visit;

program instructions to assign, by the computer, a score to each of the one or more determined locations, wherein the program instructions to assign the score to each of the one or more determined locations comprises;

program instructions to simultaneously calculate, by the computer, a subscore corresponding to a number of downstream customers affected by one or more of the voltage fault conditions;

program instructions to simultaneously calculate, by the computer, a subscore corresponding to the calculated vegetation growth value based on the one or more image sources;

program instructions to simultaneously calculate, by the computer, a subscore corresponding to the voltage data from the one or more data sensors;

program instructions to receive, by the computer, a weight value for each of the subscores; and program instructions to calculate, by the computer, a weighted score from each of the calculated subscores and the received weight values;

program instructions to identify, by the computer, a subset of one or more work orders from among a database of work orders, the subset of work orders corresponding to the one or more determined locations;

program instructions to determine, by the computer, a subset of locations from among the one or more locations based on the assigned scores and the identified subset of work orders; and program instructions to schedule, by the computer, a field visit based on the determined subset of locations.

8. The computer program product of claim 7, further comprising:

program instructions to receive, by the computer, vegetation growth data associated with the subset of locations after the scheduled field visit.

9. The computer program product of claim 8, further comprising:

program instructions to determine, by the computer a time interval for a future field visit based on the received vegetation growth value; and program instructions to schedule, by the computer, the future field visit after the determined time interval.

10. The computer program product of claim 7, wherein the one or more data sensors comprise at least one of:

a supervisory control and data acquisition (SCADA) sensor;

an advanced metering infrastructure (AMI) meter; and a power quality (PQ) sensor.

11. The computer program product of claim 7, further comprising:

program instructions to receive, by the computer, one or more images from one or more image sources; and program instructions to calculate, by the computer, a vegetation growth value based on the received images.

12. The computer program product of claim 11, wherein the one or more image sources comprise at least one of:

a street-view image;

a satellite image; and an image capture by an unmanned aircraft.

13. A computer system for managing vegetation across a distribution system, the computer system comprising:

one or more computer processors, one or more computer-readable non-transitory storage media, and program instructions stored on the one or more computer-readable non-transitory storage media for execution by at least one of the one or more computer processors, the program instructions comprising:

program instructions to receive, by a computer, voltage data from one or more data sensors;

program instructions to determine, by the computer, one or more locations of one or more voltage fault conditions based on the received voltage data and prior vegetation growth data associated with a prior field visit;

program instructions to assign, by the computer, a score to each of the one or more determined locations, wherein the program instructions to assign the score to each of the one or more determined locations comprises;

program instructions to simultaneously calculate, by the computer, a subscore corresponding to a number of downstream customers affected by one or more of the voltage fault conditions;

program instructions to simultaneously calculate, by the computer, a subscore corresponding to the calculated vegetation growth value based on the one or more image sources;

program instructions to simultaneously calculate, by the computer, a subscore corresponding to the voltage data from the one or more data sensors;

program instructions to receive, by the computer, a weight value for each of the subscores; and program instructions to calculate, by the computer, a weighted score from each of the calculated subscores and the received weight values;

program instructions to identify, by the computer, a subset of one or more work orders from among a database of work orders, the subset of work orders corresponding to the one or more determined locations;

program instructions to determine, by the computer, a subset of locations from among the one or more locations based on the assigned scores and the identified subset of work orders; and program instructions to schedule, by the computer, a field visit based on the determined subset of locations.

14. The computer system of claim 13, further comprising:
program instructions to receive, by the computer, vegetation growth data associated with the subset of locations after the scheduled field visit.

15. The computer system of claim 14, further comprising:
program instructions to determine, by the computer a time interval for a future field visit based on the received vegetation growth value; and
program instructions to schedule, by the computer, the future field visit after the determined time interval.

16. The computer system product of claim 13, wherein the one or more data sensors comprise at least one of:
a supervisory control and data acquisition (SCADA) sensor;
an advanced metering infrastructure (AMI) meter; and
a power quality (PQ) sensor.

17. The computer system of claim 13, further comprising:
program instructions to receive, by the computer, one or more images from one or more image sources; and
program instructions to calculate, by the computer, a vegetation growth value based on the received images.

* * * * *